United States Patent
Kosowsky et al.

(10) Patent No.: US 8,206,614 B2
(45) Date of Patent: **\*Jun. 26, 2012**

(54) VOLTAGE SWITCHABLE DIELECTRIC MATERIAL HAVING BONDED PARTICLE CONSTITUENTS

(75) Inventors: Lex Kosowsky, San Jose, CA (US); Robert Fleming, San Jose, CA (US)

(73) Assignee: Shocking Technologies, Inc., San Jose, CA (US)

( * ) Notice: Subject to any disclaimer, the term of this patent is extended or adjusted under 35 U.S.C. 154(b) by 182 days.

This patent is subject to a terminal disclaimer.

(21) Appl. No.: 12/356,490

(22) Filed: Jan. 20, 2009

(65) Prior Publication Data

US 2009/0212266 A1 Aug. 27, 2009

Related U.S. Application Data

(60) Provisional application No. 61/022,090, filed on Jan. 18, 2008.

(51) Int. Cl.
*H01B 1/06* (2006.01)

(52) U.S. Cl. ......... 252/511; 252/510; 219/505; 361/18; 361/56; 361/118; 361/127; 428/403; 429/232

(58) Field of Classification Search .......... 252/510, 252/511; 219/505; 361/18, 56, 118, 127; 388/21; 429/232; 428/403
See application file for complete search history.

(56) References Cited

U.S. PATENT DOCUMENTS

| | | | |
|---|---|---|---|
| 3,239,465 A | 3/1966 | Rheinfrank | |
| 3,347,724 A | 10/1967 | Schneble, Jr. et al. | |
| 3,685,026 A | 8/1972 | Wakabayashi et al. | |
| 3,685,028 A | 8/1972 | Wakabayashi et al. | |
| 3,723,635 A | 3/1973 | Smith | |
| 3,808,576 A | 4/1974 | Castonguay et al. | |
| 3,926,916 A | 12/1975 | Mastrangelo | |
| 3,977,957 A | 8/1976 | Kosowsky et al. | |
| 4,113,899 A | 9/1978 | Henry et al. | |
| 4,133,735 A | 1/1979 | Afromowitz et al. | |
| 4,252,692 A | 2/1981 | Taylor et al. | |
| 4,331,948 A | 5/1982 | Malinaric et al. | |
| 4,359,414 A | 11/1982 | Mastrangelo | |
| 4,405,432 A | 9/1983 | Kosowsky | |
| 4,439,809 A | 3/1984 | Weight et al. | |
| 4,506,285 A | 3/1985 | Einzinger | |
| 4,591,411 A | 5/1986 | Reimann | |
| 4,642,160 A | 2/1987 | Burgess | |
| 4,702,860 A | 10/1987 | Kinderov et al. | |
| 4,726,877 A | 2/1988 | Fryd et al. | |

(Continued)

FOREIGN PATENT DOCUMENTS

CH 663491 A5 12/1987

(Continued)

OTHER PUBLICATIONS

Communication pf Nov. 8, 2009 with Examination Report in European Patent Application No. 07 813 508.4, 5 pages.

(Continued)

*Primary Examiner* — Khanh Tuan Nguyen
(74) *Attorney, Agent, or Firm* — Mahamedi Paradice Kreisman LLP

(57) ABSTRACT

A voltage switchable dielectric material comprising a concentration of multi-component particles that are individually formed by a mechanical or mechanochemical bonding process that bonds a semiconductive or conductive-type host particle with multiple insulative, conductive, or semi-conductive guest particles.

16 Claims, 3 Drawing Sheets

U.S. PATENT DOCUMENTS

| | | | |
|---|---|---|---|
| 4,726,991 A | 2/1988 | Hyatt et al. | |
| 4,799,128 A | 1/1989 | Chen | |
| 4,888,574 A | 12/1989 | Rice et al. | |
| 4,892,776 A | 1/1990 | Rice | |
| 4,918,033 A | 4/1990 | Bartha et al. | |
| 4,928,199 A | 5/1990 | Diaz et al. | |
| 4,935,584 A | 6/1990 | Boggs | |
| 4,977,357 A | 12/1990 | Shrier | |
| 4,992,333 A | 2/1991 | Hyatt | |
| 4,996,945 A | 3/1991 | Dix, Jr. | |
| 5,039,452 A | 8/1991 | Thompson et al. | |
| 5,068,634 A | 11/1991 | Shrier | |
| 5,092,032 A | 3/1992 | Murakami | |
| 5,095,626 A | 3/1992 | Kitamura et al. | |
| 5,099,380 A | 3/1992 | Childers et al. | |
| 5,126,915 A | 6/1992 | Pepin et al. | |
| 5,142,263 A | 8/1992 | Childers et al. | |
| 5,148,355 A | 9/1992 | Lowe et al. | |
| 5,183,698 A | 2/1993 | Stephenson et al. | |
| 5,189,387 A | 2/1993 | Childers et al. | |
| 5,220,316 A | 6/1993 | Kazan | |
| 5,246,388 A | 9/1993 | Collins et al. | |
| 5,248,517 A | 9/1993 | Shrier et al. | |
| 5,252,195 A | 10/1993 | Kobayashi et al. | |
| 5,260,108 A | 11/1993 | Braren et al. | |
| 5,260,848 A | 11/1993 | Childers | |
| 5,262,754 A | 11/1993 | Collins | |
| 5,278,535 A | 1/1994 | Xu et al. | |
| 5,282,312 A | 2/1994 | DiStefano et al. | |
| 5,294,374 A | 3/1994 | Martinez et al. | |
| 5,295,297 A | 3/1994 | Kitamura et al. | |
| 5,300,208 A | 4/1994 | Angelopoulos et al. | |
| 5,317,801 A | 6/1994 | Tanaka et al. | |
| 5,340,641 A | 8/1994 | Xu | |
| 5,347,258 A | 9/1994 | Howard et al. | |
| 5,354,712 A | 10/1994 | Ho et al. | |
| 5,367,764 A | 11/1994 | DiStefano et al. | |
| 5,378,858 A | 1/1995 | Bruckner et al. | |
| 5,380,679 A | 1/1995 | Kano | |
| 5,393,597 A | 2/1995 | Childers et al. | |
| 5,403,208 A | 4/1995 | Felcman et al. | |
| 5,404,637 A | 4/1995 | Kawakami | |
| 5,413,694 A | 5/1995 | Dixon et al. | |
| 5,416,662 A | 5/1995 | Kurasawa et al. | |
| 5,440,075 A | 8/1995 | Kawakita et al. | |
| 5,444,593 A | 8/1995 | Allina | |
| 5,476,471 A | 12/1995 | Shifrin et al. | |
| 5,481,795 A | 1/1996 | Hatakeyama et al. | |
| 5,483,407 A | 1/1996 | Anastasio et al. | |
| 5,487,218 A | 1/1996 | Bhatt et al. | |
| 5,493,146 A | 2/1996 | Pramanik et al. | |
| 5,501,350 A | 3/1996 | Yoshida et al. | |
| 5,502,889 A | 4/1996 | Casson et al. | |
| 5,510,629 A | 4/1996 | Karpovich et al. | |
| 5,550,400 A | 8/1996 | Takagi et al. | |
| 5,557,136 A | 9/1996 | Gordon et al. | |
| 5,654,564 A | 8/1997 | Mohsen | |
| 5,669,381 A | 9/1997 | Hyatt | |
| 5,685,070 A | 11/1997 | Alpaugh et al. | |
| 5,708,298 A | 1/1998 | Masayuki et al. | |
| 5,714,794 A | 2/1998 | Tsuyama et al. | |
| 5,734,188 A | 3/1998 | Murata et al. | |
| 5,744,759 A | 4/1998 | Ameen et al. | |
| 5,781,395 A * | 7/1998 | Hyatt | 361/127 |
| 5,802,714 A | 9/1998 | Kobayashi et al. | |
| 5,807,509 A | 9/1998 | Shrier et al. | |
| 5,808,351 A | 9/1998 | Nathan et al. | |
| 5,834,160 A | 11/1998 | Ferry et al. | |
| 5,834,824 A | 11/1998 | Shepherd et al. | |
| 5,834,893 A | 11/1998 | Bulovic et al. | |
| 5,848,467 A | 12/1998 | Khandros et al. | |
| 5,856,910 A | 1/1999 | Yurchenco et al. | |
| 5,865,934 A | 2/1999 | Yamamoto et al. | |
| 5,869,869 A | 2/1999 | Hively | |
| 5,874,902 A | 2/1999 | Heinrich et al. | |
| 5,906,042 A | 5/1999 | Lan et al. | |
| 5,910,685 A | 6/1999 | Watanabe et al. | |
| 5,926,951 A | 7/1999 | Khandros et al. | |
| 5,940,683 A | 8/1999 | Holm et al. | |
| 5,946,555 A | 8/1999 | Crumly et al. | |
| 5,955,762 A | 9/1999 | Hively | |
| 5,956,612 A | 9/1999 | Elliott et al. | |
| 5,962,815 A | 10/1999 | Lan et al. | |
| 5,970,321 A | 10/1999 | Hively | |
| 5,972,192 A | 10/1999 | Dubin et al. | |
| 5,977,489 A | 11/1999 | Crotzer et al. | |
| 5,986,315 A | 11/1999 | Bost et al. | |
| 6,013,358 A | 1/2000 | Winnett et al. | |
| 6,023,028 A | 2/2000 | Neuhalfen | |
| 6,064,094 A | 5/2000 | Intrater et al. | |
| 6,108,184 A | 8/2000 | Minervini et al. | |
| 6,114,672 A * | 9/2000 | Iwasaki et al. | 219/505 |
| 6,130,459 A | 10/2000 | Intrater | |
| 6,146,552 A | 11/2000 | Iga et al. | |
| 6,160,695 A | 12/2000 | Winnett et al. | |
| 6,172,590 B1 | 1/2001 | Shrier et al. | |
| 6,184,280 B1 | 2/2001 | Shibuta | |
| 6,191,928 B1 | 2/2001 | Rector et al. | |
| 6,198,392 B1 | 3/2001 | Hahn et al. | |
| 6,211,554 B1 | 4/2001 | Whitney et al. | |
| 6,228,904 B1 | 5/2001 | Yadav et al. | |
| 6,239,687 B1 | 5/2001 | Shrier et al. | |
| 6,250,984 B1 | 6/2001 | Jin et al. | |
| 6,251,513 B1 | 6/2001 | Rector et al. | |
| 6,310,752 B1 | 10/2001 | Shrier et al. | |
| 6,316,734 B1 | 11/2001 | Yang | |
| 6,340,789 B1 | 1/2002 | Petritsch et al. | |
| 6,351,011 B1 | 2/2002 | Whitney et al. | |
| 6,373,719 B1 | 4/2002 | Behling et al. | |
| 6,407,411 B1 | 6/2002 | Wojnarowski et al. | |
| 6,433,394 B1 | 8/2002 | Intrater | |
| 6,448,900 B1 | 9/2002 | Chen | |
| 6,455,916 B1 | 9/2002 | Robinson | |
| 6,468,593 B1 | 10/2002 | Iizawa et al. | |
| 6,512,458 B1 | 1/2003 | Kobayashi et al. | |
| 6,522,237 B1 | 2/2003 | Ito et al. | |
| 6,534,422 B1 | 3/2003 | Ichikawa et al. | |
| 6,542,065 B2 | 4/2003 | Shrier et al. | |
| 6,549,114 B2 | 4/2003 | Whitney et al. | |
| 6,570,765 B2 | 5/2003 | Behling et al. | |
| 6,593,597 B2 | 7/2003 | Sheu | |
| 6,628,498 B2 | 9/2003 | Whitney et al. | |
| 6,642,297 B1 | 11/2003 | Hyatt et al. | |
| 6,657,532 B1 | 12/2003 | Shrier et al. | |
| 6,693,508 B2 | 2/2004 | Whitney et al. | |
| 6,741,217 B2 | 5/2004 | Toncich et al. | |
| 6,762,237 B2 | 7/2004 | Glatkowski et al. | |
| 6,781,506 B2 | 8/2004 | Schemenaur et al. | |
| 6,797,145 B2 | 9/2004 | Kosowsky | |
| 6,882,051 B2 | 4/2005 | Majumdar et al. | |
| 6,911,676 B2 | 6/2005 | Yoo | |
| 6,916,872 B2 | 7/2005 | Yadav et al. | |
| 6,981,319 B2 | 1/2006 | Shrier | |
| 7,031,132 B1 | 4/2006 | Mitchell | |
| 7,034,652 B2 | 4/2006 | Whitney et al. | |
| 7,049,926 B2 | 5/2006 | Shrier et al. | |
| 7,053,468 B2 | 5/2006 | Lee | |
| 7,064,353 B2 | 6/2006 | Bhat | |
| 7,132,697 B2 | 11/2006 | Weimer et al. | |
| 7,132,922 B2 * | 11/2006 | Harris et al. | 338/22 SD |
| 7,141,184 B2 | 11/2006 | Chacko et al. | |
| 7,173,288 B2 | 2/2007 | Lee et al. | |
| 7,183,891 B2 | 2/2007 | Harris et al. | |
| 7,202,770 B2 | 4/2007 | Harris et al. | |
| 7,205,613 B2 | 4/2007 | Fjelstad et al. | |
| 7,218,492 B2 | 5/2007 | Shrier | |
| 7,274,910 B2 | 9/2007 | Gilbert et al. | |
| 7,320,762 B2 | 1/2008 | Greuter et al. | |
| 7,408,203 B2 | 8/2008 | Kim et al. | |
| 7,417,194 B2 | 8/2008 | Shrier | |
| 7,446,030 B2 | 11/2008 | Kosowsky | |
| 7,505,239 B2 | 3/2009 | Kanazawa et al. | |
| 7,528,467 B2 | 5/2009 | Lee | |
| 7,593,203 B2 | 9/2009 | Dudnikov et al. | |
| 7,609,141 B2 * | 10/2009 | Harris et al. | 338/21 |
| 7,626,198 B2 | 12/2009 | Hirakata et al. | |
| 7,688,598 B2 | 3/2010 | Dudnikov et al. | |

| | | |
|---|---|---|
| 7,793,326 B2 | 9/2010 | Kosowsky et al. |
| 7,998,370 B2 | 8/2011 | Hama et al. |
| 2001/0043141 A1 | 11/2001 | Tuttle |
| 2002/0004258 A1 | 1/2002 | Nakayama et al. |
| 2002/0050912 A1 | 5/2002 | Shrier et al. |
| 2002/0061363 A1 | 5/2002 | Halas et al. |
| 2003/0008123 A1 | 1/2003 | Glatkowski et al. |
| 2003/0008989 A1 | 1/2003 | Gore et al. |
| 2003/0010960 A1 | 1/2003 | Greuter et al. |
| 2003/0078332 A1 | 4/2003 | Dardi |
| 2003/0079910 A1 | 5/2003 | Kosowsky |
| 2003/0151029 A1 | 8/2003 | Hsu et al. |
| 2003/0160570 A1 | 8/2003 | Sasaki et al. |
| 2003/0207978 A1 | 11/2003 | Yadav et al. |
| 2003/0218851 A1* | 11/2003 | Harris et al. ............. 361/118 |
| 2003/0221966 A1 | 12/2003 | Bonkass et al. |
| 2004/0062041 A1 | 4/2004 | Cross et al. |
| 2004/0063294 A1 | 4/2004 | Durocher et al. |
| 2004/0063839 A1 | 4/2004 | Kawate et al. |
| 2004/0095658 A1 | 5/2004 | Buretea et al. |
| 2004/0154828 A1 | 8/2004 | Moller et al. |
| 2004/0160300 A1 | 8/2004 | Shrier |
| 2004/0178713 A1 | 9/2004 | Na et al. |
| 2004/0201941 A1* | 10/2004 | Harris et al. ............. 361/127 |
| 2004/0211942 A1 | 10/2004 | Clark et al. |
| 2004/0241894 A1 | 12/2004 | Nagai et al. |
| 2004/0262583 A1 | 12/2004 | Lee |
| 2005/0026334 A1 | 2/2005 | Knall |
| 2005/0039949 A1 | 2/2005 | Kosowsky |
| 2005/0057867 A1* | 3/2005 | Harris et al. ............. 361/56 |
| 2005/0083163 A1 | 4/2005 | Shrier |
| 2005/0106098 A1* | 5/2005 | Tsang et al. ............. 424/1.11 |
| 2005/0121653 A1 | 6/2005 | Chacko |
| 2005/0184387 A1 | 8/2005 | Collins et al. |
| 2005/0208304 A1 | 9/2005 | Collier et al. |
| 2005/0218380 A1 | 10/2005 | Gramespacher et al. |
| 2005/0231091 A1 | 10/2005 | Bouchard et al. |
| 2005/0274455 A1 | 12/2005 | Extrand |
| 2005/0274956 A1 | 12/2005 | Bhat |
| 2005/0275070 A1 | 12/2005 | Hollingsworth |
| 2006/0035081 A1 | 2/2006 | Morita et al. |
| 2006/0060880 A1 | 3/2006 | Lee et al. |
| 2006/0142455 A1 | 6/2006 | Agarwal et al. |
| 2006/0152334 A1 | 7/2006 | Maercklein et al. |
| 2006/0154070 A1* | 7/2006 | Wakiya et al. ............. 428/403 |
| 2006/0166474 A1 | 7/2006 | Vereecken et al. |
| 2006/0167139 A1 | 7/2006 | Nelson et al. |
| 2006/0181826 A1 | 8/2006 | Dudnikov, Jr. et al. |
| 2006/0181827 A1 | 8/2006 | Dudnikov, Jr. et al. |
| 2006/0193093 A1 | 8/2006 | Bertin et al. |
| 2006/0199390 A1 | 9/2006 | Dudnikov, Jr. et al. |
| 2006/0211837 A1 | 9/2006 | Ko et al. |
| 2006/0214156 A1 | 9/2006 | Pan et al. |
| 2006/0234127 A1* | 10/2006 | Kim et al. ............. 429/232 |
| 2006/0291127 A1 | 12/2006 | Kim et al. |
| 2006/0293434 A1 | 12/2006 | Yodh et al. |
| 2007/0114640 A1 | 5/2007 | Kosowsky |
| 2007/0116976 A1 | 5/2007 | Tan et al. |
| 2007/0123625 A1 | 5/2007 | Dorade et al. |
| 2007/0126018 A1 | 6/2007 | Kosowsky |
| 2007/0139848 A1* | 6/2007 | Harris et al. ............. 361/118 |
| 2007/0146941 A1* | 6/2007 | Harris et al. ............. 361/18 |
| 2007/0208243 A1 | 9/2007 | Gabriel et al. |
| 2008/0023675 A1 | 1/2008 | Kosowsky |
| 2008/0029405 A1 | 2/2008 | Kosowsky |
| 2008/0032049 A1 | 2/2008 | Kosowsky |
| 2008/0035370 A1 | 2/2008 | Kosowsky |
| 2008/0045770 A1 | 2/2008 | Sigmund et al. |
| 2008/0050856 A1 | 2/2008 | Chu et al. |
| 2008/0073114 A1 | 3/2008 | Kosowsky |
| 2008/0186053 A1 | 8/2008 | Malekkhosravi |
| 2008/0299298 A1 | 12/2008 | Kim et al. |
| 2008/0313576 A1 | 12/2008 | Kosowsky |
| 2009/0044970 A1 | 2/2009 | Kosowsky |
| 2009/0050856 A1 | 2/2009 | Kosowsky |
| 2009/0071368 A1 | 3/2009 | Steingrover et al. |
| 2009/0114425 A1 | 5/2009 | Lee et al. |
| 2009/0117021 A1 | 5/2009 | Smith et al. |
| 2009/0220771 A1 | 9/2009 | Kosowsky |
| 2009/0242855 A1 | 10/2009 | Kosowsky |
| 2009/0256669 A1 | 10/2009 | Kosowsky |
| 2010/0047535 A1 | 2/2010 | Kosowsky et al. |
| 2010/0222462 A1 | 9/2010 | Yamauchi et al. |
| 2010/0243302 A1 | 9/2010 | Kosowsky et al. |
| 2010/0263200 A1 | 10/2010 | Kosowsky |
| 2010/0264224 A1 | 10/2010 | Kosowsky |
| 2010/0264225 A1 | 10/2010 | Kosowsky |
| 2010/0270545 A1 | 10/2010 | Kosowsky |
| 2010/0270546 A1 | 10/2010 | Kosowsky |
| 2010/0271831 A1 | 10/2010 | Kosowsky et al. |
| 2010/0281453 A1 | 11/2010 | Kosowsky et al. |
| 2010/0281454 A1 | 11/2010 | Kosowsky et al. |
| 2011/0234363 A1 | 9/2011 | Kosowsky et al. |

FOREIGN PATENT DOCUMENTS

| | | |
|---|---|---|
| CN | 101261892 A | 9/2008 |
| DE | 3040784 A1 | 5/1982 |
| DE | 10115333 A1 | 1/2002 |
| DE | 102004049053 A1 | 5/2005 |
| DE | 102006047377 A1 | 4/2008 |
| EP | 790 758 A1 | 8/1997 |
| EP | 1 003 229 A1 | 5/2000 |
| EP | 1003229 A1 | 5/2000 |
| EP | 1 245 586 A2 | 10/2002 |
| EP | 1 580 809 A2 | 9/2005 |
| EP | 1 542 240 A2 | 6/2006 |
| EP | 1 857 871 A1 | 4/2007 |
| EP | 1 990 834 A2 | 11/2008 |
| JP | 56091464 A | 7/1981 |
| JP | 60-091489 A | 5/1985 |
| JP | 62-137807 A | 6/1987 |
| JP | 63 195275 A | 8/1988 |
| JP | 63-196672 A | 8/1988 |
| JP | 11-067966 A | 3/1999 |
| JP | 11-345292 A | 12/1999 |
| JP | 2000 062076 A | 2/2000 |
| JP | 2000-067646 A | 3/2000 |
| JP | 2002-353003 A | 12/2002 |
| JP | 2003-163104 A | 6/2003 |
| JP | 2003-288567 A | 10/2003 |
| JP | 2003-346108 A | 12/2003 |
| JP | 2004-014466 A | 1/2004 |
| JP | 2005-224953 A | 8/2005 |
| WO | WO 88/00526 | 1/1988 |
| WO | WO 89/06859 A2 | 7/1989 |
| WO | WO 96/02922 A2 | 2/1996 |
| WO | WO 96/02924 A1 | 2/1996 |
| WO | WO 96/02944 A1 | 2/1996 |
| WO | WO 97/26665 A1 | 7/1997 |
| WO | WO 98/23018 A1 | 5/1998 |
| WO | WO 99/24992 A1 | 5/1999 |
| WO | WO 99/49525 A1 | 9/1999 |
| WO | WO 02/103085 A1 | 12/2002 |
| WO | WO 03/032335 A1 | 4/2003 |
| WO | WO 03/057359 A2 | 7/2003 |
| WO | WO 2005/100426 A1 | 10/2005 |
| WO | WO 2006/130366 | 12/2006 |
| WO | WO 2007/062170 A2 | 5/2007 |
| WO | WO 2007/0062171 | 5/2007 |
| WO | WO 2008/016858 A1 | 2/2008 |
| WO | WO 2008/016859 A1 | 2/2008 |
| WO | WO 2008/024207 | 2/2008 |
| WO | WO 2008/036984 A2 | 3/2008 |
| WO | WO 2008/153584 A1 | 12/2008 |
| WO | WO 2009/026299 | 2/2009 |
| WO | WO 2010/039902 A2 | 4/2010 |

OTHER PUBLICATIONS

Facchetti, Antonio, "Semiconductors for Organic Transistors", Materials Today, vol. 10, No. 3, pp. 28-37.
Reese, Colin and Bao, Zhenan, "Organic Single-Crystal Field-Effect Transistors", Materials Today, vol. 10, No. 3, pp. 20-27.
U.S. Appl. No. 11/903,820, filed Sep. 24, 2007, Kosowsky.
U.S. Appl. No. 12/714,354, filed Feb. 26, 2010, Fleming.
U.S. Appl. No. 12/714,358, filed Feb. 26, 2010, Fleming.
U.S. Appl. No. 12/717,102, filed Mar. 3, 2010, Kosowsky et al.
U.S. Appl. No. 12/731,557, filed Mar. 25, 2010, Kosowsky.

Fullerene Chemistry—Wikipedia, http://en.wikipedia.org/wiki/Fullerene/chemistry, 6 pages, printed Apr. 8, 2010.
International Preliminary Report on Patentability for International Application PCT/US2008/073603 mailed Mar. 4, 2010, 7 pages.
International Search Report, Written Opinion and Notice of Transmittal of Same mailed Apr. 16, 2010 for International Application PCT/US2009/062844 20 pages.
International Search Report, Written Opinion and Notice of Transmittal of Same mailed Apr. 20, 2010 for International Application PCT/US2009/059134 22 pages.
International Search Report, Written Opinion, and Notice of Transmittal of same mailed Mar. 18, 2010 for International Application PCT/US2010/021889 15 pages.
Non-Final Office Action mailed Apr. 20, 2010 in U.S. Appl. No. 11/829,946, 20 pages.
Non-Final Office Action dated Apr. 14, 2010 in U.S. Appl. No. 12/714,358, 17 pages
Non-Final Office Action dated Apr. 13, 2010 in U.S. Appl. No. 12/714,354, 17 pages.
Advisory Action mailed Jun. 13, 2007 in U.S. Appl. No. 10/180,078.
Examination Report of May 24, 2011 in European Application 09724188.9.
Final Office Action mailed Apr. 13, 2011 in U.S. Appl. 11/829,948.
Final Office Action mailed Aug. 1, 2011 in U.S. Appl. No. 11/860,522.
Final Office Action mailed Jul. 1, 2011 in U.S. Appl. No. 12/571,318.
Final Office Action mailed Mar. 3, 2011 in U.S. Appl. 11/562,222.
Final Office Action mailed May 5, 2011 in U.S. Appl. No. 12/193,603.
Final Office Action mailed Apr. 8, 2011 in U.S. Appl. 12/820,939.
Invitation to Pay Additional Fees with partial Search Report for International Application PCT/US2010/058435 mailed Feb. 25, 2011.
Non-Final Office Action mailed Jul. 20, 2011 in U.S. Appl. No. 12/417,589.
Non-Final Office Action mailed Jul. 11, 2011 in U.S. Appl. No. 12/407,347.
Non-Final Office Action mailed Apr. 28, 2011 in U.S. Appl. No. 12/638,360.
Non-Final Office Action mailed Aug. 8, 2011 in U.S. Application No. 11/562,222.
Notice of Allowance mailed Apr. 14, 2011 in U.S. Appl. 12/832,040.
Notice of Allowance mailed Mar. 18, 2011 in U.S. Appl. No. 12/703,723.
Notice of Allowance mailed Apr. 28, 2011 in U.S. Appl. 12/703,674.
Notice of Allowance mailed May 6, 2011 in U.S. Appl. No. 12/703,701.
Request for Reconsideration after Final Rejection filed May 15, 2007 in U.S. Appl. No. 10/180,078.
Response to Final Office Action filed Jan. 9, 2006 in U.S. Appl. No. 10/180,078.
Translation of Office Action of Mar. 24, 2011 in Chinese Application No. 200680043467.8.
Examination Report of Jan. 21, 2011 in European Application No. 07813509.2.
Examination Report of Jan. 21, 2011 in European Application No. 07813508.4.
Non-Final Office Action mailed Jan. 13, 2011 in U.S. Appl. 12/832,022.
Non-Final Office Action mailed Sep. 27, 2010 in U.S. Appl 11/829,948.
Non-Final Office Action mailed Jan. 13, 2011 in U.S. Appl. 12/832,033.
Non-Final Office Action mailed Jan. 20, 2011 in U.S. Appl. 11/829,951.
Translation of Office Action of Oct. 26,2010 in Chinese App. No. 200780035255.X.
U.S. Appl. No. 12/878,344, filed Sep. 9, 2010, Kosowsky et al.
U.S. Appl. No. 12/954,605, filed Nov. 24,2010, Shi et al.
Examination Report for European Application 06838319.9 mailed May 7, 2010.
Examination Report for European Application 07813509.2-1218 mailed Jul. 2, 2010.
Examination Report for European Application 07813508.4-1218 mailed Jul. 2, 2010.
Extended European Search Report for European Application 10158080.1 mailed Jul. 1, 2010.
Final Office Action mailed Oct. 13, 2010 in U.S. Appl. No. 11/829,946.
Final Office Action mailed Oct. 13, 2010 in U.S. Appl. No. 12/714,358.
International Preliminary Report on Patentability mailed Oct. 7, 2010 in PCT/US2009/038429.
International Preliminary Report on Patentability mailed Oct. 28, 2010 in PCT/US2009/040384.
Non-Final Office Action mailed Jul. 20, 2010 in U.S. Appl. No. 11/562,222.
Non-Final Office Action mailed Sep. 28, 2010 in U.S. Appl. No. 12/703,701.
Non-Final Office Action mailed Dec. 1, 2010 in U.S. Appl. No. 11/860,522.
Non-Final Office Action mailed NOv. 10, 2010 in U.S. Appl. No. 12/571,318.
Non-Final Office Action mailed Sep. 28, 2010 in U.S. Appl. No. 12/703,674.
Non-Final Office Action mailed Oct. 6, 2010 in U.S. Appl. No. 12/714,354.
Non-Final Office Action mailed Oct. 7, 2010 in U.S. Appl. No. 12/832,040.
Non-Final Office Action mailed Oct. 22, 2010 in U.S. Appl. No. 12/820,939.
Non-Final Office Action mailed Dec. 1, 2010 in U.S. Appl. No. 12/193,603.
Non-Final Office Action mailed Sep. 27, 2010 in U.S. Appl. No. 12/703,723.
Notice of Allowance mailed Jun. 21, 2010 in U.S. Appl. No. 11/860,530.
Notice of Allowance mailed Sep. 7, 2010 in U.S. Appl. No. 11/562,289.
Office Action Issued Jul. 29, 2010 in Chinese Application No. 200780028607.9.
Translation of Office Action of Jul. 7, 2010 in Chinese Application 200680043524.2.
Translation of Office Action of Jul. 12, 2010 in Chinese Application 200780028617.2.
Final Office Action mailed Feb. 23, 2011 in U.S. Appl. No. 12/714,354.
Translation of Office Action of Jan. 26, 2011 in Chinese Application No. 200780028617.2.
Translation of Office Action of Jan. 26, 2011 in Chinese Application No. 200780028607.9.
Examination Report of Jun. 30 2011 in Malaysian Application No. PI 20081699.
Examination Report of Jul. 27, 2011 in EP application 09791586.2.
Final Office Action mailed Aug. 11, 2011 in U.S. Appl. No. 12/832,022.
Final Office Action mailed Aug. 11, 2011 in U.S. Appl. No. 12/832,033.
Final Office Action mailed Aug. 11, 2011 in U.S. Appl. No. 11/829,951.
International Preliminary Report on Patentability of Aug. 4, 2011 in International App. No. PCT/US2010/021889.
International Search Report, Written Opinion, Notice of Transmittal of same mailed Oct. 28, 2011 in PCT/US2010/060617.
Non-Final Office Action mailed Aug. 29, 2011 in U.S. Appl. No. 11/829,946.
Non-Final Office Action mailed Sep. 2, 2011 in U.S. Appl. No. 12/714,354.
Non-Final Office Action mailed Sep. 13, 2011 in U.S. Appl. No. 12/714,358.
Non-Final Office Action mailed Oct. 11, 2011 in U.S. Appl. No. 12/820,939.
Supplemental European Search Report of Aug. 26, 2011 in EP 08798195.5.
Translation of Office Actopm of Aug. 10, 2011 in Chinese Application No. 200780028617.2.

Translation of Office Action of Sep. 6, 2011 in Japanese App. No. 2009-522983.
Translation of Office Action of Sep. 6, 2011 in Japanese App. No. 2009-522984.
Translation of Office Action of Jun. 28, 2011 in Japanese App. No. 2008-542453.
Translation of Office Action of Jun. 14, 2011 in Japanese App. No. 2008-542454.
Translation of Office Action of Aug. 24, 2011 in Chinese App. No. 200780053354.0.
Translation of Office Action of Aug. 3, 2011 in Chinese App. No. 200780035255.X.
U.S. Appl. No. 11/562,222, filed Nov. 21, 2006, Kosowsky.
U.S. Appl. No. 12/356,490, filed Jan. 20, 2009, Kosowsky.
U.S. Appl. No. 12/370,589, filed Feb. 12, 2009, Kosowsky.
U.S. Appl. No. 12/561,195, filed Sep. 16, 2009, Kosowsky et al.
U.S. Appl. No. 12/571,318, filed Sep. 30, 2009, Kosowsky et al.
U.S. Appl. No. 12/607,952, filed Oct. 28, 2009, Fleming et al.
U.S. Appl. No. 12/638,360, filed Dec. 15, 2009, Fleming et al.
U.S. Appl. No. 12/638,632, filed Dec. 15, 2009, Fleming et al.
U.S. Appl. No. 12/642,799, filed Dec. 19, 2009, Fleming et al.
U.S. Appl. No. 12/692,573, filed Jan. 22, 2010, Fleming et al.
U.S. Appl. No. 12/703,674, filed Feb. 10, 2010, Kosowsky et al.
U.S. Appl. No. 12/703,701, filed Feb. 10, 2010, Kosowsky et al.
U.S. Appl. No. 12/703,723, filed Feb. 10, 2010, Kosowsky et al.
Breton et al., "Mechanical properties of multiwall carbon nanotubes/epoxy composites: influence of network morphology," Carbon Elsevier UK, vol. 42, No. 5-6, pp. 1027-1030 (2004).
Celzard, A., et al., "Conduction Mechanisms in Some Graphite-polymer Composites: The Effect of a Direct-current Electric Field", Journal of Physics: Condensed Matter, 9 (1997) pp. 2225-2237.
Communication of Nov. 23, 2009 with Supp European Search Report and Opinion, European Application No. 06 838 319.9 7 pages.
Communication of Nov. 11, 2009 with Examination Report in European Patent Application No. 07 813 509.2 5 pages.
Communication pf Nov. 9, 2009 with Examination Report in European Patent Application No. 07 813 508.4, 5 pages.
Communication with Examination Report mailed Dec. 23, 2009 in European app. 06838276.1-2203, 6 pgs.
Facchetti, Antonio, "Semiconductors for Organic Transistors", Materials Today, vol. 10, No. 3, pp. 28-37, (Mar. 2007).
Granstrom et al., "laminated fabrication of polymeric photovoltaic diodes," Nature, vol. 395, pp. 257-260 (1998).
Guo et al., "Block Copolymer Modified Novolac Epoxy Resin," Polymer Physics, vol. 41, No. 17, pp. 1994-2003 (2003).
International Preliminary Report on Patentability in International Application PCT/US2007/074677, Feb. 3, 2009, 8 pages.
International Preliminary Report on Patentability for International Application PCT/US06/045291, ISA/US, mailed Mar. 24, 2009, 8 pages.
International Preliminary Report on Patentability for International Application PCT/US07/079377 mailed Dec. 30, 2009, 8 pages.
International Search Report and Written Opinion in International Application PCT/US2007/079345, mailed Nov. 7, 2008, 25 pages.
International Search Report and Written Opinion of the International Searching Authority in International Application PCT/US2007/074677, European Patent Office, Dec. 5, 2007, 13 pages.
International Search Report and Written Opinion of the International Searching Authority in International Application PCT/US2008/073603, US Patent Office, Nov. 17, 2008, 7 pages.
International Search Report and Written Opinion in International Application PCT/US2009/038429 mailed Aug. 18, 2009, 20 pgs.
International Search Report and Written Opinion of the International Searching Authority in International Application PCT/US2007/079377, European Patent Office, Mar. 7, 2008, 13 pages.
International Search Report and Written Opinion of the International Searching Authority in International Application PCT/US06/45291, United States Patent Office, Mar. 5, 2008, 14 pages.
International Search Report and Written Opinion of the International Searching Authority in International Application PCT/US09/040384, European Patent Office, Jul. 2, 2009, 15 pages.
International Search Report and Written Opinion mailed Nov. 12, 2009 in International Application PCT/US2009/054062, 15 pages.
International Search Report and Written Opinion mailed Nov. 17, 2009 in International Application PCT/US2009/057209, 14 pages.
International Search Report and Written Opinion of the International Searching Authority in International Application PCT/US06/45292, United States Patent Office, Feb. 14, 2008, 10 pages.
Levinson et al., "The Physics of metal oxide varistors," J. Applied Physics, 46(3): 1332-1341 (1975).
Modine, F.A. and Hyatt, H.M. "New Varistor Material", Journal of Applied Physics, 64 (8), Oct. 15, 1988, pp. 4229-4232.
Notice of Allowance Jan. 14, 2010 U.S. Appl. No. 11/562,289 9pages.
Onoda et al., "Photoinduced Charge Transfer of Conducting Polymer Compositions," IEICE Trans. Electronics, vol. E81-C(7), pp. 1051-1056 (1998).
Raffaelle et al., "Nanomaterial Development for Polymeric Solar Cells," IEEE 4th World Conf on Photovoltaic energy Conversion, pp. 186-189 (2006).
Reese, Colin and Bao, Zhenan, "Organic Single-Crystal Field-Effect Transistors", Materials Today, vol. 10, No. 3, pp. 20-27, Mar. 2007.
Saunders et al., "Nanoparticle-polymer photovoltaic cells," Adv. Colloid Int. Sci., vol. 138, No. 1, pp. 1-23 (2007).
U.S. Appl. No. 13/291,090, filed Nov. 7, 2011, Vasquez et al.
International Preliminary Report on Patentability of May 19, 2011 in International App. No. PCT/US2009/062844.
Non-Final Office Action mailed Dec. 30, 2011 in U.S. Appl. No. 12/561,195.
Office Action Issued Nov. 2, 2011 in Chinese Application No. 200680043524.2.
Translation of Office Action of Oct. 31, 2011 in Chinese App. No. 20098010307.0.
Final Office Action mailed Apr. 11, 2012 in U.S. Appl. No. 11/562,222.
Final Office Action mailed Apr. 3, 2012 in U.S. Appl. No. 12/638,360.
Gonjay et al., "Evaluation and identification of electrical and thermal conduction mechanisms in carbon nanotube/epoxy composites," Polymer, 47:2036-2045 (2006).
International Search Report, Written Opinion, Notice of Transmittal of same mailed Mar. 5, 2012 in PCT/US2011/059659.
International Search Report, Written Opinion, Notice of Transmittal of same mailed Mar. 2, 2012 in PCT/US2010/058435.
Non-Final Office Action mailed Mar. 28, 2012 in U.S. Appl. No. 12/834,296.
Non-Final Office Action mailed Feb. 23, 2012 in U.S. Appl. No. 12/820,956.
Non-Final Office Action mailed Feb. 29, 2012 in U.S. Appl. No. 12/607,952.
Non-Final Office Action mailed Mar. 15, 2012 in U.S. Appl. No. 12/370,589.
Non-Final Office Action mailed Apr. 3, 2012 in U.S. Appl. No. 12/820,897.
Notice of Allowance mailed Feb. 2, 2012 in U.S. Appl. No. 12/417,589.
Office Action of Jan. 31, 2012 in Korean Patent Application 2010-7023158.
Translation of Final Office Action of Feb. 28, 2012 in Japanese App. No. 2008-542453.
Translation of Office Action of Feb. 17, 2012 in Chinese App. No. 200780028617.2.
Translation of Office Action of Mar. 19, 2012 in Chinese App. No. 200780028607.9.
Translation of Office Action of Jan. 31, 2012 in Chinese App. No. 200980109972.1.
Translation of Office Action of Mar. 29, 2012 in Chinese App. No. 200680043467.8.

* cited by examiner

VOLTAGE SWITCHABLE DIELECTRIC MATERIAL HAVING BONDED PARTICLE CONSTITUENTS

RELATED APPLICATIONS

This application claims benefit of priority to Provisional U.S. Patent Application No. 61/022,090, entitled PROCESS FOR MAKING VOLTAGE SWITCHABLE POLYMER COMPOSITE MATERIALS, filed Jan. 18, 2008; the aforementioned priority application being incorporated by reference herein in its entirety.

FIELD OF ART

This application relates to compositions of voltage switchable dielectric material. More specifically, this application pertains to voltage switchable dielectric material having bonded particle constituents.

BACKGROUND

Voltage switchable dielectric (VSD) materials are known to be materials that are insulative at low voltages and conductive at higher voltages. These materials are typically composites comprising of conductive, semiconductive, and insulative particles in an insulative polymer matrix. These materials are used for transient protection of electronic devices, most notably electrostatic discharge protection (ESD) and electrical overstress (EOS). Generally, VSD material behaves as a dielectric, unless a characteristic voltage or voltage range is applied, in which case it behaves as a conductor. Various kinds of VSD material exist. Examples of voltage switchable dielectric materials are provided in references such as U.S. Pat. No. 4,977,357, U.S. Pat. No. 5,068,634, U.S. Pat. No. 5,099,380, U.S. Pat. No. 5,142,263, U.S. Pat. No. 5,189,387, U.S. Pat. No. 5,248,517, U.S. Pat. No. 5,807,509, WO 96/02924, and WO 97/26665, all of which are incorporated by reference herein.

VSD materials may be formed using various processes and materials or compositions. One conventional technique provides that a layer of polymer is filled with high levels of metal particles to very near the percolation threshold, typically more than 25% by volume. Semiconductor and/or insulator materials is then added to the mixture.

Another conventional technique provides for forming VSD material by mixing doped metal oxide powders, then sintering the powders to make particles with grain boundaries, and then adding the particles to a polymer matrix to above the percolation threshold.

Other techniques and compositions for forming VSD material are described in U.S. patent application Ser. No. 11/829,946, entitled VOLTAGE SWITCHABLE DIELECTRIC MATERIAL HAVING CONDUCTIVE OR SEMI-CONDUCTIVE ORGANIC MATERIAL; and U.S. patent application Ser. No. 11/829,948, entitled VOLTAGE SWITCHABLE DIELECTRIC MATERIAL HAVING HIGH ASPECT RATIO PARTICLES.

DETAILED DESCRIPTION

Figure 1:
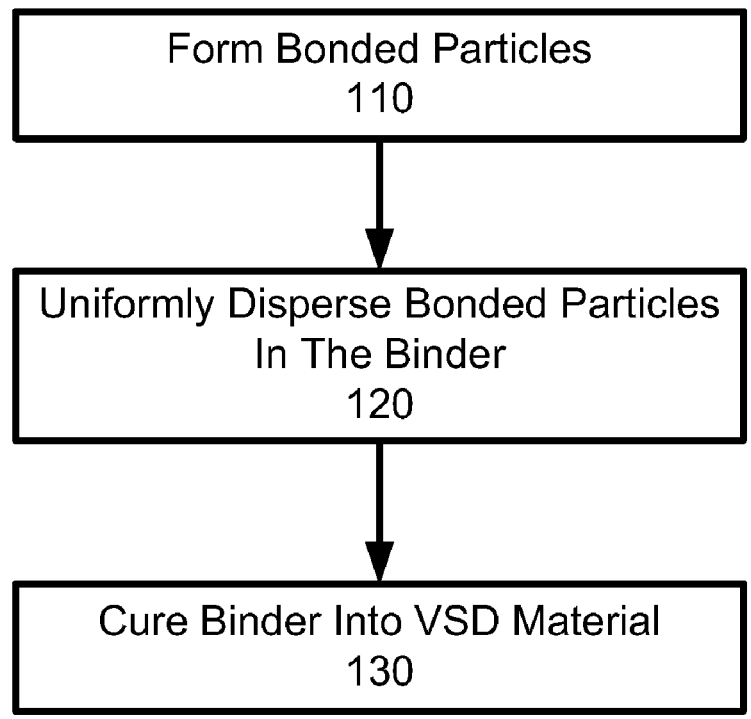
FIG. 1 illustrates a process for forming VSD material using bonded particles, under an embodiment.

Embodiments described herein provide a voltage switchable dielectric material comprising a concentration of multi-component particles that are individually formed by a mechanical or mechanochemical bonding process that bonds a conductive-type host particle with multiple insulative or semi-conductive guest particles.

As used herein, "voltage switchable material" or "VSD material" is any composition, or combination of compositions, that has a characteristic of being dielectric or non-conductive, unless a field or voltage is applied to the material that exceeds a characteristic level of the material, in which case the material becomes conductive. Thus, VSD material is a dielectric unless voltage (or field) exceeding the characteristic level (e.g. such as provided by ESD events) is applied to the material, in which case the VSD material is switched into a conductive state. VSD material can further be characterized as a nonlinear resistance material. In many applications, the characteristic voltage of VSD material ranges in values that exceed the operational voltage levels of the circuit or device several times over. Such voltage levels may be of the order of transient conditions, such as produced by electrostatic discharge, although embodiments may include use of planned electrical events. Furthermore, one or more embodiments provide that in the absence of the voltage exceeding the characteristic voltage, the material behaves similar to the binder (i.e. it is non-conductive or dielectric).

Still further, an embodiment provides that VSD material may be characterized as material comprising a binder mixed in part with conductor or semi-conductor particles. In the absence of voltage exceeding a characteristic voltage level, the material as a whole adapts the dielectric characteristic of the binder. With application of voltage exceeding the characteristic level, the material as a whole adapts conductive characteristics.

According to embodiments described herein, the constituents of VSD material may be uniformly mixed into a binder or polymer matrix. In one embodiment, the mixture is dispersed at nanoscale, meaning the particles that comprise the conductive/semi-conductive material are nano-scale in at least one dimension (e.g. cross-section) and a substantial number of the particles that comprise the overall dispersed quantity in the volume are individually separated (so as to not be agglomerated or compacted together).

Still further, an electronic device may be provided with VSD material in accordance with any of the embodiments described herein. Such electrical devices may include substrate devices, such as printed circuit boards, semiconductor packages, discrete devices, thin-film electronics, Light Emitting Diodes (LEDs), radio-frequency (RF) components, and display devices.

Embodiments described herein provide for use of nano and micro-sized particles as constituents of VSD material. In particular, nano and micro-sized particles may be bonded onto other conductive or semi-conductive particles, and the combined particles are distributed uniformly in a binder to form a VSD composition.

In one embodiment, the combined particles are distributed uniformly in a suitable binder at a concentration level that is at or just below the percolation threshold. In other embodiments, nano or micro-sized particles are selected for bonding with larger particles, so that the concentration of particles (conductor and semiconductor particles bonded with nano or micro sized semi-conductive or insulative particles) in the binder exceeds the percolation threshold. The percolation threshold may coincide with the concentration of particles needed to make the VSD material behave as a conductor at a relatively low voltage (substantially less than the clamp or trigger voltage). In many cases, the percolation threshold may coincide with a conductor or semiconductor particle concentration in range of 20-80% by volume (depending on physical characteristics of the particles, such as size).

As described herein, the bonded particles may individually include a conductor (or semi-conductor) that is bonded or coated with multiple nano/micro-sized particles. The nano/micro-sized particles may be uniformly distributed to coat the larger particles individually. The coated particles may also be uniformly distributed in the binder material. In an embodiment, the coated particles are distributed uniformly at nano-scale in the binder to form VSD material of desired electrical characteristics.

Embodiments recognize that micro and nano sized particles are difficult to uniformly distribute and use in the context described, as such particles usually exhibit strong cohesiveness (and an inherent tendency to aggregate), low flowability, and low stability. In order to facilitate use of nano and micro sized particles, embodiments employ techniques by which such small particles are directly bonded to a host particle, and the resulting combination is then uniformly distributed at nano-scale within a suitable matrix or binder to form VSD material.

FIG. 1 illustrates a process for forming VSD material using bonded particles, under an embodiment. In step 110, bonded particles are formed by combining relatively larger conductive or semi-conductive particles with smaller insulative or semiconductive micro or nano sized particiles. In an embodiment, MechanoChemical Bonding (MCB) techniques and systems are used in order to form bonded particles that have a direct and solid bond between (i) nano and micro-sized particles that are coated onto (ii) larger conductive or semi-conductive host particles. In general, MCB systems use mechanical energy, without binders, to create the direct and solid bonds. Variations to MCB bonding techniques may also be used, including plasma assisted MCB systems. In particular, the application of mechanical energy can be assisted with the use of plasma to clean the surface of the particles and enhance their "solid bonding". MCB technology is different from ball milling or fluidized bed reactors because no fluid, milling media, or another other additives (other than the particles themselves) are required.

Step 120 provides that the bonded particles are uniformly dispersed at nano-scale in a suitable binder. A sonic agitator may uniformly mix the bonded particles into the binder.

Step 130 provides that the mixed binder composition is cured into a VSD composition. The binder may be applied on a target site in order to cure it into the desired VSD composition.

Figure 2:
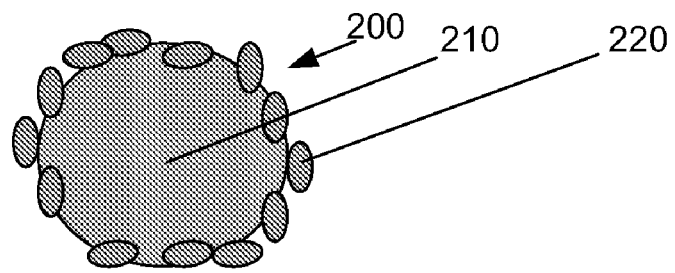
FIG. 2 illustrates a bonded particle 200 that may be formed using MCB techniques or systems, for use in composition of VSD material, according to an embodiment.

As described with an embodiment of FIG. 1, MCB systems and machines provide one technique by which conductor, semiconductor, and/or insulative particles to be coated on each other directly to form bonded particle constituents of VSD material. FIG. 2 illustrates a bonded multi-component particle 200 that may be formed using MCB techniques or systems, for use in composition of VSD material, according to an embodiment. In one embodiment, a conductive core (or "host") particle 210 is identified with suitable electrical properties. Suitable material for use as host particle 210 include, for example, nickel, aluminum, titanium, or stainless steel. The host particle 210 is coated with so-called "guest" particles 220 using MCB systems or techniques. The result is formation of particles that singularly comprise (i) a host particle, and (ii) one or more guest particles (i.e. multi-component particle). Reference is made to Table 1, which lists combinations of suitable host material and guest material to form non-linear conductive particles. Such non-linear conductive particles may be distributed in a binder to form the VSD material that has desired electrical properties (such as clamping/trigger voltage).

In one implementation, guest particles 220 are insulative or semiconductive materials, as well as organic materials. As illustrated by Table 1, examples of insulative type material for guest particles 220 include silicon dioxide and aluminum oxide. Suitable conductive and/or semiconductive material for guest particles 220 may also include organic or inorganic materials, such as single or double-walled carbon nanotubes, graphenes, or carbon black. Various other combinations may also be provided.

Table 1 lists examples of conductive type host particles 210, coated with either semiconductive or insulative type guest particles 220 at varying thicknesses.

| Host Material | Guest Material | Thickness |
|---|---|---|
| Novamet Nickel INP400 or 4SP-10 | Degussa P25 TiO2 | 10 wt % Guest |
| Novamet Nickel INP400 or 4SP-10 | Degussa P25 TiO2 | 20 wt % Guest |
| Novamet Nickel INP400 or 4SP-10 | Degussa R300 SiO2 | 10 wt % Guest |
| Novamet Nickel INP400 or 4SP-10 | Degussa R300 SiO2 | 20 wt % Guest |
| Novamet Nickel INP400 or 4SP-10 | PV Fast Red B | 10 wt % Guest |
| Novamet Nickel INP400 or 4SP-10 | PV Fast Red B | 20 wt % Guest |
| HC Starck TiB2 Grade D | Degussa P25 TiO2 | 10 wt % Guest |
| HC Starck TiB2 Grade D | Degussa P25 TiO2 | 20 wt % Guest |
| HC Starck TiB2 Grade D | Degussa R300 SiO2 | 10 wt % Guest |
| HC Starck TiB2 Grade D | Degussa R300 SiO2 | 20 wt % Guest |
| HC Starck TiB2 Grade D | PV Fast Red B | 10 wt % Guest |
| HC Starck TiB2 Grade D | PV Fast Red B | 20 wt % Guest |

With specific reference to FIG. 2, a suitable conductive type host particle 210 is titanium diboride, and a suitable guest particle 220 may correspond to perylene (such as provided by PV FAST RED B from Clariant).

Figure 3:
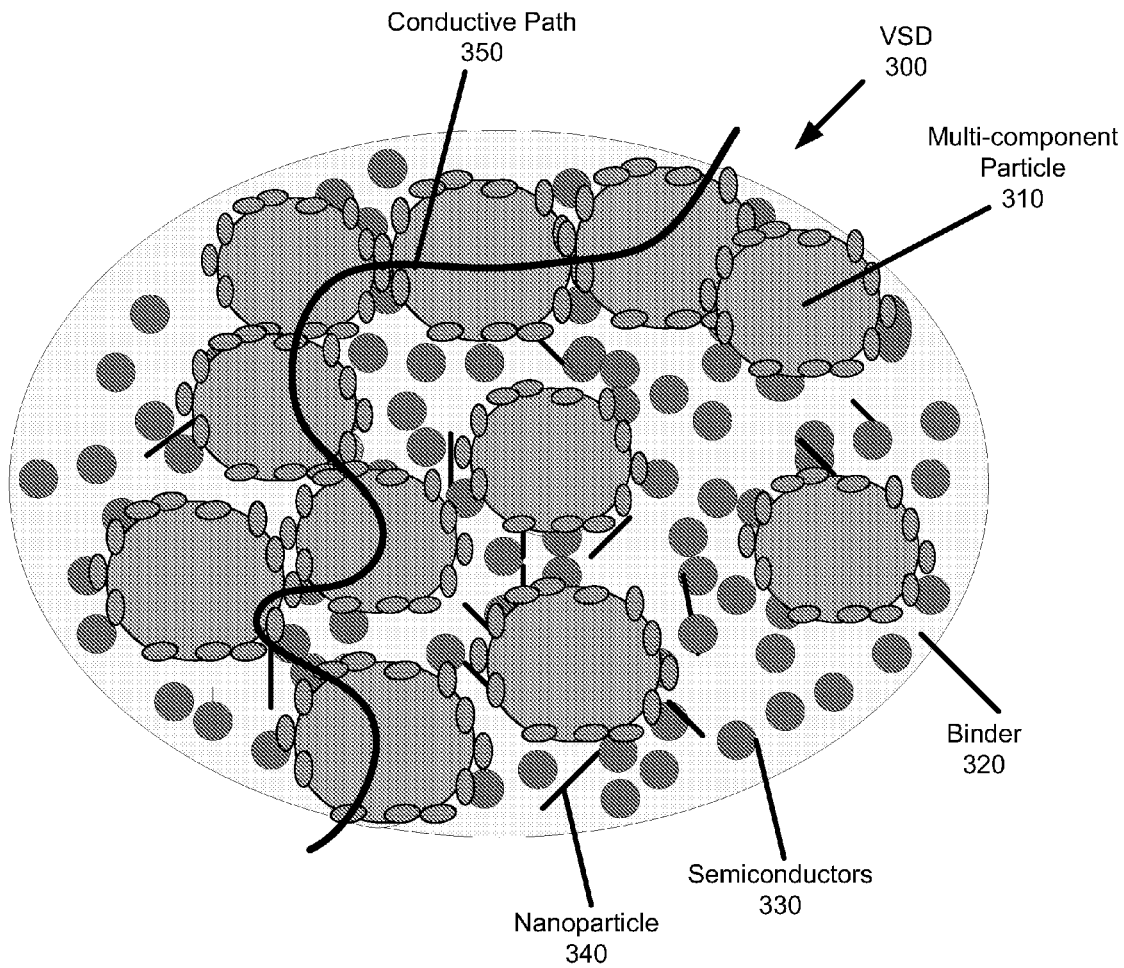
FIG. 3 illustrates a composition of VSD material that includes multi-component particles (formed by bonding processes), as described with previous embodiments.

The singular particles formed from the combination of the host particles 210 and the guest particles 220 (as shown in FIG. 2) are collectively used to form VSD or non-linear resistive material, as described by a technique of FIG. 1 (and further illustrated by FIG. 3). The use of bonding techniques such as described above enable the formation of bonded particles as VSD constituents, without use of sintering. The ability to form such bonded particles without sintering enables better distribution of guest particles 220 about individual host particles 210. Additionally, in contrast to some conventional approaches for forming non-linear resistive materials using sintering processes, the use of MCB or similar techniques or processes does not damage heat-sensitive particles. For example, organic guest particles 220 may be used without concern that such particles would be damaged by heat.

While Table 1 lists several examples, numerous other combinations of materials may be used for both host particles 210 and guest particles 220. In one embodiment, the host particle 210 is conductive and of the order of 10-100 times larger in dimension than the guest particle 220. As another example, the host particle 210 corresponds to Nickel or Titanium Diboride, which are conductors that can have a diameter that ranges from 6 to 12 microns. In these examples, the host particle 210 may be coated with a 20-30 nanometer semiconductor (e.g. 26 nm perylene, which is organic, or nano-dimensioned titanium dioxide).

In another implementation, small or thin insulators (or semi-conductors) may be used for conductive purposes. Specifically, a conductive host particle 210 may be coated with small dimensioned insulators as the guest particles 220. Such small dimensional insulators may correspond to fumed Silica (7 nm dimensioned). As a thin insulator, conduction can occur using the thin insulator through quantum tunneling.

Table 2 lists examples of both host particles (first three rows) and guest particles (last three rows).

TABLE 2

| Vendor | Material | Grade | Bulk Density | "Apparent" Density | d50 (micron) |
|---|---|---|---|---|---|
| HC Starck | Titanium Diboride | D | 4.52 | 1 | 6 |
| Accumet | Titanium Diboride | | 4.52 | 1 | 12 |
| Novamet | Nickel | 4SP-10 | 8.9 | 5.2 | 6.6 |
| Degussa | Titanium Dioxide | P25 | 3.93 | 0.13 | 0.021 |
| Degussa | Fumed Silica | R300 | 2.2 | 0.05 | 0.007 |
| Clariant | Perylene | PV Fast Red | 1.4 | 1 | 0.026 |

In the examples of Table 2, the first 3 rows illustrate suitable Host particles, while the last 3 rows provide additional examples of Guest particles.

Thus numerous specific examples and embodiments are provided for herein, embodiments include coated particles for use in a composition of VSD material, where (i) the host particle 210 is a conductor or semiconductor (having micron (s) sized dimension); and (ii) the guest particle 220 is either conductor, semiconductor, or insulator that is nano or submicron sized.

More conductive host particles 210 can receive more guest particles 220, particularly organic material, which can 'stick' better or form better bonds with the host particle 210. However, in other embodiments, the host particle 210 is a semiconductor, and the dimension of the Host particle as compared to the guest particle 220 may vary beyond the 10-100 ratio recited.

In one embodiment, the type of guest particle 220 used may also be conductive. Still further, the type of guest particle 220 may be both conductive and organic, thus providing enhanced bonding and additional conductivity.

Still further, an embodiment provides for additional coats or guest particles 220. Specifically, one or more embodiments provide for individual host particles 210 in the composition to be bonded with two or more types of guest particles 220. As an alternative or addition, the host particle 210 may be combined with an organic semiconductor particle.

With any of the embodiments described, the specific composition used may be varied depending on the electrical properties that are desired from the formed VSD or non-linear resistive material. FIG. 3 illustrates a composition of VSD material that includes multi-component particles (formed by bonding processes), as described with previous embodiments. In an embodiment, a sample of VSD material 300 includes conductive particles (or host) 310, having guest material 320 formed through MCB bonding, and semiconductive particles 330. Some embodiments of VSD material include high aspect ratio (HAR) conductive or semiconductive fillers ("HAR particles 340"). Suitable HAR particles 340 include, for example, carbon nanotubes, nanorods, or nanowires.

As depicted in FIG. 3, the concentration of the particle constituents in the binder exceeds the percolation threshold. This means the particles, including the bonded multi-component particles 310, are loaded into the binder 320 so that a particle path 350 is formed that extends across a thickness of the VSD material. The particle path 350 is signified by the particles being in contact with one another. Thus, when the particle concentration exceeds the percolation threshold, the formation of complete particle paths that extend the thickness of the VSD material is likely. In absence of guest material 330, the presence of the particle path 350 would likely render the composition conductive, so as to not have a dielectric state (i.e. VSD characteristics). The use of guest material 330, however, enables the semi- or non-conductive electrical properties of the guest material to provide a buffer that requires presence of field before the particle path is conductive. In this way, the guest material 330 can be selected to significantly influence the clamp or trigger voltage of the VSD material. Optionally semiconductive host materials may be coated with conductive guest materials and loaded to just below percolation.

As an addition or alternative to an embodiment such as depicted by FIG. 3, the composition of the VSD material may further comprise single-component conductor (or semi-conductor) particles. Thus, separate concentrations of conductor elements and multi-component conductor elements (with guest material that may be insulative or semiconductive) may be used in some compositions of VSD material. Likewise, as depicted, separate concentrations of high aspect ratio nanoparticles may be dispersed in the VSD material (e.g. graphenes, carbon nanotubes, nanowires, nanorods, antimony tin oxide (ATO) nanorods).

VSD Material Applications

Numerous applications exist for compositions of VSD material in accordance with any of the embodiments described herein. In particular, embodiments provide for VSD material to be provided on substrate devices, such as printed circuit boards, semiconductor packages, discrete devices, thin film electronics, as well as more specific applications such as LEDs and radio-frequency devices (e.g. RFID tags). Still further, other applications may provide for use of VSD material such as described herein with a liquid crystal display, organic light emissive display, electrochromic display, electrophoretic display, or back plane driver for such devices. The purpose for including the VSD material may be to enhance handling of transient and overvoltage conditions, such as may arise with ESD events. Another application for VSD material includes metal deposition, as described in U.S. Pat. No. 6,797,145 to L. Kosowsky (which is hereby incorporated by reference in its entirety).

Figure 4A:
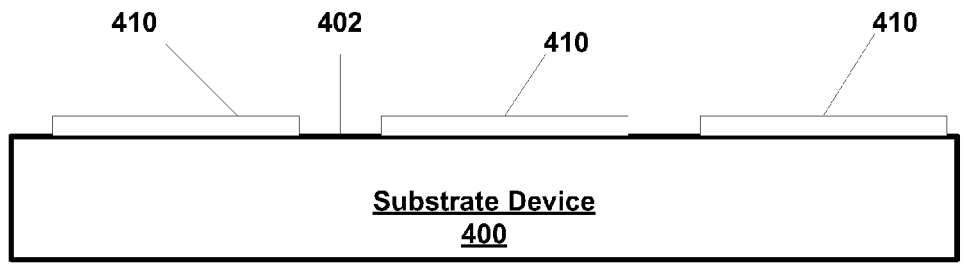
FIG. 4A and FIG. 4B each illustrate different configurations for a substrate device that is configured with VSD material having a composition such as described with any of the embodiments provided herein.
Figure 4B:
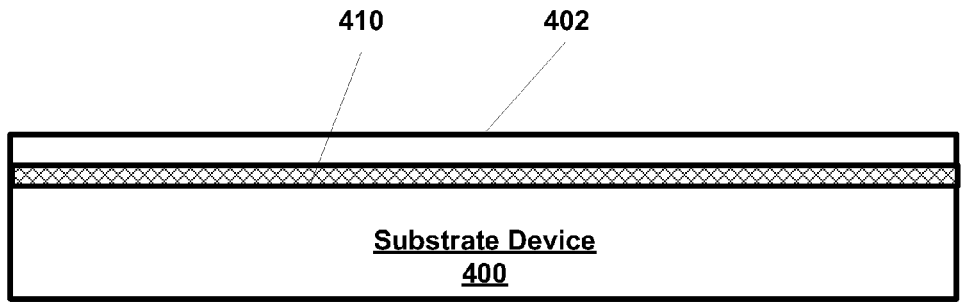

FIG. 4A and FIG. 4B each illustrate different configurations for a substrate device that is configured with VSD material having a composition such as described with any of the embodiments provided herein. In FIG. 4A, the substrate device 400 corresponds to, for example, a printed circuit board. In such a configuration, VSD material 410 (having a composition such as described with any of the embodiments described herein) may be provided on a surface 402 to ground a connected element. As an alternative or variation, FIG. 4B illustrates a configuration in which the VSD material forms a grounding path that is embedded within a thickness 410 of the substrate.

Electroplating

In addition to inclusion of the VSD material on devices for handling, for example, ESD events, one or more embodiments contemplate use of VSD material (using compositions such as described with any of the embodiments herein) to form substrate devices, including trace elements on substrates, and interconnect elements such as vias. U.S. patent application Ser. No. 11/881,896, filed on September Jul. 29, 2007, and which claims benefit of priority to U.S. Pat. No. 6,797,145 (both of which are incorporated herein by reference in their respective entirety) recites numerous techniques for electroplating substrates, vias and other devices using VSD material. Embodiments described herein enable use of VSD material, as described with any of the embodiments in this application.

Other Applications

Figure 5:
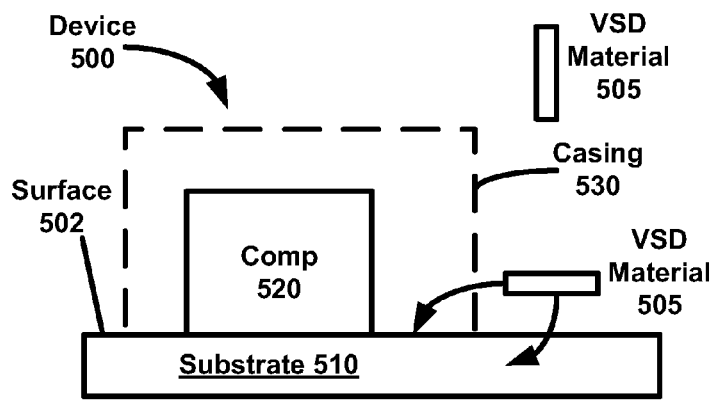
FIG. 5 is a simplified diagram of an electronic device on which VSD material in accordance with embodiments described herein may be provided.

FIG. 5 is a simplified diagram of an electronic device on which VSD material in accordance with embodiments described herein may be provided. FIG. 5 illustrates a device 500 including substrate 510, component 520, and optionally casing or housing 530. VSD material 505 (in accordance with any of the embodiments described) may be incorporated into any one or more of many locations, including at a location on a surface 502, underneath the surface 502 (such as under its trace elements or under component 520), or within a thickness of substrate 510. Alternatively, the VSD material may be incorporated into the casing 530. In each case, the VSD material 505 may be incorporated so as to couple with conductive elements, such as trace leads, when voltage exceeding the characteristic voltage is present. Thus, the VSD material 505 is a conductive element in the presence of a specific voltage condition.

With respect to any of the applications described herein, device 500 may be a display device. For example, component 520 may correspond to an LED that illuminates from the substrate 510. The positioning and configuration of the VSD material 505 on substrate 510 may be selective to accommodate the electrical leads, terminals (i.e. input or outputs) and other conductive elements that are provided with, used by or incorporated into the light-emitting device. As an alternative, the VSD material may be incorporated between the positive and negative leads of the LED device, apart from a substrate. Still further, one or more embodiments provide for use of organic LEDs, in which case VSD material may be provided, for example, underneath the OLED.

With regard to LEDs and other light emitting devices, any of the embodiments described in U.S. patent application Ser. No. 11/562,289 (which is incorporated by reference herein) may be implemented with VSD material such as described with other embodiments of this application.

Alternatively, the device 500 may correspond to a wireless communication device, such as a radio-frequency identification device. With regard to wireless communication devices such as radio-frequency identification devices (RFID) and wireless communication components, VSD material may protect the component 520 from, for example, overcharge or ESD events. In such cases, component 520 may correspond to a chip or wireless communication component of the device. Alternatively, the use of VSD material 505 may protect other components from charge that may be caused by the component 520. For example, component 520 may correspond to a battery, and the VSD material 505 may be provided as a trace element on a surface of the substrate 510 to protect against voltage conditions that arise from a battery event. Any composition of VSD material in accordance with embodiments described herein may be implemented for use as VSD material for device and device configurations described in U.S. patent application Ser. No. 11/562,222 (incorporated by reference herein), which describes numerous implementations of wireless communication devices which incorporate VSD material.

As an alternative or variation, the component 520 may correspond to, for example, a discrete semiconductor device. The VSD material 505 may be integrated with the component, or positioned to electrically couple to the component in the presence of a voltage that switches the material on.

Still further, device 500 may correspond to a packaged device, or alternatively, a semiconductor package for receiving a substrate component. VSD material 505 may be combined with the casing 530 prior to substrate 510 or component 520 being included in the device.

Embodiments described with reference to the drawings are considered illustrative, and Applicant's claims should not be limited to details of such illustrative embodiments. Various modifications and variations will may be included with embodiments described, including the combination of features described separately with different illustrative embodiments. Accordingly, it is intended that the scope of the invention be defined by the following claims. Furthermore, it is contemplated that a particular feature described either individually or as part of an embodiment can be combined with other individually described features, or parts of other embodiments, even if the other features and embodiments make no mentioned of the particular feature.

What is claimed is:

1. A composition comprising:
a binder;
particles dispersed uniformly within the binder, wherein at least some of the particles are multi-component particles that singularly comprise: a conductive host particle that is micron sized, and multiple insulative or semi-conductive guest particles that are nano or sub-micron sized;
wherein at least some of the particles comprise the conductive host particle being bonded with the multiple insulative or semi-conductive guest particles through mechanical or mechano-chemical bonding; and
wherein said composition is (i) dielectric in absence of any voltage that exceeds a characteristic voltage level, and (ii) conductive with application of a voltage that exceeds the characteristic voltage level.

2. The composition of claim 1, wherein the particles are dispersed into the binder beyond a percolation threshold.

3. The composition of claim 2, wherein the percolation threshold coincides with a conductor or semiconductor particle concentration in range of 20-80% by volume.

4. The composition of claim 1, wherein the guest particles include organic material.

5. The composition of claim 4, wherein the organic material corresponds to carbon nanotubes, perylene, or graphene.

6. The composition of claim 1, wherein the multiple insulative or semi-conductive guest particles includes titanium dioxide or fumed silica.

7. The composition of claim 1, wherein at least some of the particles are (i) selected from a group consisting of graphenes, carbon nanotubes, nanowires, nanorods, antimony in oxide (ATO) nanorods, and (ii) uniformly dispersed in the binder.

8. The composition of claim 1, wherein the particles are dispersed into the binder beyond a percolation threshold, and wherein the characteristic voltage is dependent in part on a resistive characteristic of the multiple insulative or semi-conductive guest particles of the multi-component particles.

9. A composition comprising:
- a binder;
- particles dispersed uniformly within the binder, wherein at least some of the particles are multi-component particles that singularly comprise: a conductive host particle, and multiple insulative or semi-conductive guest particles that include organic material;
- wherein at least some of the particles comprise the conductive host particle being bonded with the multiple insulative or semi-conductive guest particles through mechanical or mechano-chemical bonding; and
- wherein said composition is (i) dielectric in absence of any voltage that exceeds a characteristic voltage level, and (ii) conductive with application of a voltage that exceeds the characteristic voltage level.

10. The composition of claim 9, wherein the particles are dispersed into the binder beyond a percolation threshold.

11. The composition of claim 10, wherein the percolation threshold coincides with a conductor or semiconductor particle concentration in range of 20-80% by volume.

12. The composition of claim 9, wherein, for the at least some of the multi-component particles, the conductive host particle are micron sized, and multiple insulative or semi-conductive guest particles are nano or sub-micron sized.

13. The composition of claim 9, wherein the organic material corresponds to carbon nanotubes, perylene, or graphene.

14. The composition of claim 9, wherein the multiple insulative or semi-conductive guest particles includes titanium dioxide or fumed silica.

15. The composition of claim 9, wherein at least some of the particles are (i) selected from a group consisting of graphenes, carbon nanotubes, nanowires, nanorods, antimony in oxide (ATO) nanorods, and (ii) uniformly dispersed in the binder.

16. The composition of claim 9, wherein the particles are dispersed into the binder beyond a percolation threshold, and wherein the characteristic voltage is dependent in part on a resistive characteristic of the multiple insulative or semi-conductive guest particles of the multi-component particles.

* * * * *